United States Patent [19]

Takahashi

[11] Patent Number: 5,132,555
[45] Date of Patent: Jul. 21, 1992

[54] SEMICONDUCTOR INTEGRATED CIRCUIT

[75] Inventor: Toshiro Takahashi, Ohme, Japan

[73] Assignee: Hitachi, Ltd., Tokyo, Japan

[21] Appl. No.: 648,997

[22] Filed: Jan. 31, 1991

[30] Foreign Application Priority Data

Feb. 23, 1990 [JP] Japan ................... 2-43576

[51] Int. Cl.$^5$ ............................................. G05F 1/56
[52] U.S. Cl. ............................. 307/296.1; 307/296.8; 307/303
[58] Field of Search .......... 307/296.1, 296.8, 296.6, 307/303, 303.2, 304

[56] References Cited

U.S. PATENT DOCUMENTS

| | | | |
|---|---|---|---|
| 4,482,985 | 11/1984 | Itoh et al. | 307/296.3 |
| 4,585,955 | 4/1986 | Uchida | 307/296.8 |
| 4,780,854 | 10/1988 | Watanabe et al. | 307/296.8 |
| 4,788,455 | 11/1988 | Mori et al. | 307/296.8 |
| 4,833,341 | 5/1989 | Watanabe et al. | 307/296.1 |
| 4,984,202 | 1/1991 | Kawahara et al. | 357/43 |
| 5,023,476 | 6/1991 | Watanabe et al. | 307/296.1 |
| 5,053,909 | 10/1991 | Suzuki et al. | 307/303 |
| 5,081,374 | 1/1992 | Davis | 307/296.1 |

FOREIGN PATENT DOCUMENTS 63-95653  4/1988  Japan ................... 307/296.1

OTHER PUBLICATIONS

"A BiCOMS Channelless Masterslice with On-Chip Voltage Converter", 13.1 of ISSCCC, 1989, pp. 176-177.
Nikkei Microdevice, Mar. 1989, pp. 64-67.

Primary Examiner—Eugene R. LaRoche
Assistant Examiner—Tan Dinh
Attorney, Agent, or Firm—Fay, Sharpe, Beall, Fagan, Minnich & McKee

[57] ABSTRACT

In a semiconductor integrated circuit including, as a power-supply voltage converter for converting an external power-supply voltage into a lower internal power-supply voltage and supplying the converted voltage to the internal circuit, a reference voltage generator and an internal power-supply voltage supplier for outputting an internal power-supply voltage according to the reference voltage output from the reference voltage generator, the external power supply systems for the reference voltage generator and the internal power-supply voltage supplier are isolated from each other on the high level side, low level side, or both.

38 Claims, 8 Drawing Sheets

SEMICONDUCTOR INTEGRATED CIRCUIT

BACKGROUND OF THE INVENTION

The present invention relates to a semiconductor integrated circuit incorporating a power-supply voltage converter for converting an external power-supply voltage into an internal power-supply voltage adapted for an internal circuit. More particularly, it relates to techniques for reducing power-supply noises, and, for example, it relates to techniques effective for use in microcomputers.

With the progress of processing technologies of semiconductor integrated circuits, a considerable advance has been made in miniaturization of the devices. Consequently, the withstand voltage of some of such devices is becoming not high enough to stand the voltage of a single power supply hitherto used, for example, at 5 V. For the users who construct systems by combining various semiconductor integrated circuits, it is not desirable that the system requires plural levels of power-supply voltages, but it is desirable that it only requires such an external power-supply voltage as 5 V in common with conventional semiconductor integrated circuits. Accordingly, in a semiconductor integrated circuit for which processes as short as 0.5 μm or below are executed, such a system is generally used in which a power-supply voltage converter is incorporated in the semiconductor integrated circuit and, while the external power-supply voltage is kept at 5 V, the internal power-supply voltage is decreased to 3 V, for example, by such converter and supplied to its internal circuit.

Conventional power-supply voltage converter circuits include a reference voltage generator for generating a voltage serving as a reference voltage and an internal power-supply voltage supplier for lowering the external power-supply voltage according to the reference voltage and supplying the lowered voltage to an internal circuit, both the circuits operating on the same external power-supply voltage from their common external power supply system.

A semiconductor integrated circuit incorporating such power-supply voltage converter has two systems, i.e., an external power supply system and an internal power supply system, and the external power is directly supplied to the semiconductor integrated circuit through its external terminal, i.e., an external power-supply pin on the package. In the case of a semiconductor integrated circuit consuming great power, there are provided numbers of external power-supply pins or power-supply pads on the chip of the semiconductor integrated circuit, so that the external power-supply voltage is supplied to such circuits as the power-supply voltage converter from the power-supply wiring of the same system connected to such external power-supply pins or the power-supply pads.

As to examples of semiconductor integrated circuit incorporating a power-supply voltage converter, there are a publication, "A BICMOS Channelless Masterslice With On-Chip Voltage Converter", in THPM 13.1 of ISSCC, 1989, pp. 176-177, and another in Nikkei Microdevice, March 1989, pp. 64 to 67.

While the external pin on the package and the pad on the chip of a semiconductor integrated circuit are connected through a bonding wire or lead, the bonding wires or leads have parasitic inductance and resistance components, amounts of which are not negligible. Currents for charging and discharging capacitive loads flow through power supply systems when a semiconductor integrated circuit operates, and, a great amount of current flows, especially, for driving an external capacitive load. Since such current flows through the above described inductance component or resistance component, there is produced a voltage drop across a bonding wire or the like. Such voltage drop leads to an undershoot of the power-supply potential on the high-level side, or an overshoot of the power-supply potential on the lower-level side, within the semiconductor integrated circuit, so that the power-supply voltage varies within the chip even if the external power-supply voltage supplied to the semiconductor integrated circuit is held constant. If the voltage variation is transmitted through the internal circuit as a power-supply noise, a malfunction occurs. These facts were made known through the investigation of the inventor.

However, conventional power-supply voltage converters have been arranged such that both the reference voltage generator for generating the reference voltage and the internal power-supply voltage supplier for decreasing the external power-supply voltage according to the reference voltage and supplying the decreased voltage to the internal circuit are supplied with the same external power-supply voltage from their common external power-supply system, and therefore, the power-supply noise generated in the external power supply system is transmitted also to the reference voltage generator, and when this circuit is affected by the voltage variation, the reference voltage is also varied. Consequently, the internal power-supply voltage is also varied and the thus produced power-supply noise is transmitted to the internal circuit, resulting in deterioration in the performance of the internal circuit or occurrance of a malfunction therein. These facts have also been made known through the investigation of the inventor.

SUMMARY OF THE INVENTION

An object of the present invention is to provide a semiconductor integrated circuit capable of suppressing variation or, further, causing no variation at all, in the internal power-supply voltage even if a power-supply noise is produced in the outer power-supply voltage due to the internal operation thereof.

Another object of the present invention is to provide a semiconductor integrated circuit in which the internal circuit operating on the output power of a power-supply voltage converter has an excellent resistivity to the power-supply noise.

The above and other objects and novel features of the present invention will become more apparent from the description herein read in connection with the accompanying drawings.

Representative aspects of the invention disclosed herein will be briefly described below.

In a semiconductor integrated circuit including, as a power-supply voltage converter for converting an external power-supply voltage into a lower internal power-supply voltage and supplying it to an internal circuit, a reference voltage generator and an internal power-supply voltage supplier for outputting the internal power-supply voltage according to the reference voltage output from the reference voltage generator, according to the present invention, the external power supply systems for the reference voltage generator and the internal power-supply voltage supplier are isolated from each other on the high level side, low level side, or both.

More specifically, in the case of a semiconductor integrated circuit including a complementary MOS circuit formed on a p-type semiconductor substrate, the external power supply system for the reference voltage generator and the internal power-supply voltage supplier are isolated from each other on the high level side. In the case of a semiconductor integrated circuit including a complementary MOS circuit formed on a n-type semiconductor substrate, the external power supply systems for the reference voltage generator and the internal power-supply voltage supplier are isolated from each other on the low level side. The reason why the measure is taken only for the high level side or the low level side as described above is because it is intended preferentially to prevent occurrence of latch-up.

In the case of semiconductor integrated circuit constituted of a complementary MOS circuit of an SOS or SOI structure, in which transistors of different types of conduction are separately formed on an insulating substrate and which, therefore, has a good resistivity against the latch-up, similar measures can be taken for both the low level side and the high level side without caring about the problem of the latch-up.

In the above described arrangements, if it is desired to have a system structure convenient for use, it may be adapted such that the external power supply systems isolated from each other are externally supplied with the same voltage.

In order to reduce the number of the reference voltage generators, the wirings for supplying the reference voltages may be formed at the peripheral portion of the substrate and the reference voltages may be supplied in parallel or in common to a plurality of internal power-supply voltage suppliers.

The buffer circuit connected with the external circuit at the peripheral portion of the substrate receives both the external power-supply voltage and the internal power-supply voltage. In order to further stabilize the operation of the internal power-supply voltage supplier even if a relatively great change in the power-supply current is produced on account of simultaneous outputting operations of multiple bits in the buffer circuit, the external power-supply voltage may be supplied to the buffer circuit through a power supply system isolated from the power supply system for the power-supply voltage converter.

With the described arrangement, the internal power-supply voltage output from the internal power-supply voltage supplier allows charging and discharging currents to flow depending on the operations of the internal circuit and the buffer circuit, and thereby, the power-supply current from the internal power-supply voltage supplier varies. This variation in the current tends to generate a potential difference, on account of inductance components and resistance components parasitic on the bonding wires and leads included in the external power supply system for the reference voltage generator, across the same. At this time, because the reference voltage generator is supplied with external power from a system isolated from the power supply system for the internal power-supply voltage supplier and because the current flowing therethrough is stationary and relatively small in amount, there is produced substantially no current change in the external power supply system separately provided for the reference voltage generator. Accordingly, the reference voltage output from the reference voltage generator is kept constant. Then, the internal power-supply voltage supplier is controlled for its operating point by the constant reference voltage and, hence, it functions so as to keep the internal power-supply voltage constant. As a result, such variations as overshoot and undershoot of the internal power-supply voltage are prevented from occurring and, hence, malfunction of the internal circuit and the buffer circuit can be prevented and fast operation of them can be assured.

DESCRIPTION OF THE PREFERRED EMBODIMENTS

Figure 1:
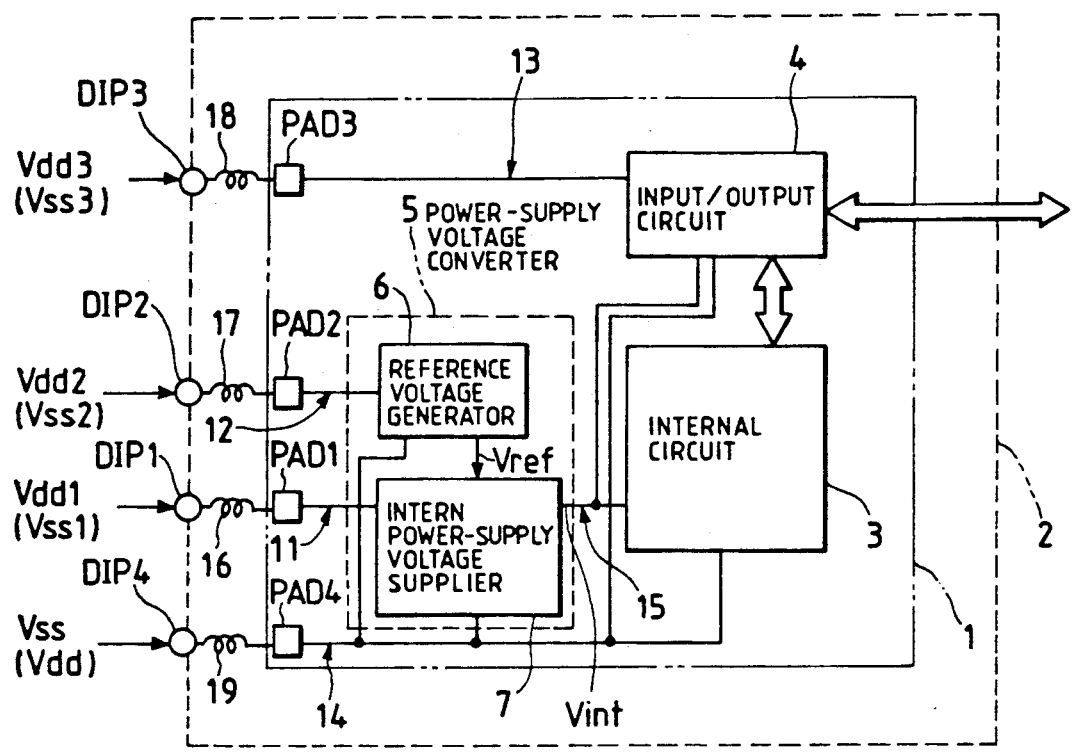
FIG. 1 is an overall block diagram of a semiconductor integrated circuit according to an embodiment of the present invention, with attention paid to the power supply systems.

FIG. 1 shows a semiconductor integrated circuit according to a first embodiment of the present invention with attention paid to its power supply system.

Referring to FIG. 1, reference numeral 1 denotes a semiconductor substrate formed of such a material as silicon and 2 denotes a package of a dual in-line type.

On the semiconductor substrate 1, there are formed an internal circuit 3 having logical and storage functions, an input/output circuit 4 for transferring signals between the internal circuit 3 and external circuits, a power-supply voltage converter 5 for supplying power-supply voltage to the circuits, and so forth.

The power-supply voltage converter 5 is for converting an external power-supply voltage of 5 V to a lower internal voltage of 3.3 V, for example, and supplying the internal voltage to the internal circuit 3 and others, and it is constituted of a reference voltage generator 6 and an internal power-supply voltage supplier 7 for generating and outputting an internal power-supply voltage Vint according to a reference voltage Vref output from the reference voltage generator 6.

The power supply system of the semiconductor integrated circuit is classified into two systems, one thereof being the supply system of the external power directly supplied from the outside (external power supply system) and the other thereof being the supply system of the internal power output from the power-supply voltage converter 5 (internal power supply system). In the case of FIG. 1, it is arranged, though not limited to this arrangement, such that the external power supply system and the internal power supply system are isolated from each other on the high level side of the power supply and connected in common on the low level side thereof.

More specifically, though not limited to this, the external power supply system on the high level side is separated into three systems, i.e., a first external power supply system 11 extending from a representatively shown external power-supply pin DIP1 to the inside through a representatively shown power-supply pad PAD1, a second external power supply system 12 extending from a representatively shown external power-supply pin DIP2 to the inside through a representatively shown power-supply pad PAD2, and a third external power supply system 13 extending from a representatively shown external power-supply pin DIP3 to the inside through a representatively shown power-supply pad PAD3, and these systems are respectively supplied with voltages Vdd1 to Vdd3 each thereof being equal to 5 V, for example, through power-supply wirings on a wiring substrate, not shown. The external power supply system on the low level side is defined, though not limited to this, as a fourth system 14 extending from a representatively shown external power-supply pin DIP4 to the inside through a representatively shown power-supply pad PAD4, and it is supplied with a voltage $V_{ss}$ being 0 V of the ground potential, for example, through a power-supply wiring on a wiring substrate, not shown. For convenience, the voltages Vdd1 to Vdd3 will herein be referred to also as "external power-supply voltage". The internal power supply system 15 is defined as the paths extending from the output of the internal power-supply voltage supplier 7 to the input/output circuit 4 and the internal circuit 3, and it supplies a voltage Vint at, for example, 3.3 V, which hereinafter will be briefly referred to also as "internal power-supply voltage".

The external power-supply voltage Vdd1 is applied to the internal power-supply voltage supplier 7 through the first external power supply system 11 and decreased therein to a voltage level at 3.3 V, for example, and this voltage is supplied to the internal circuit 3 and the input/output circuit 4 as the internal power-supply voltage Vint. The power-supply voltage Vdd2 is supplied to the reference voltage generator 6 and the power-supply voltage Vdd3 is supplied to the input/output circuit 4 through their respective power-supply systems 12 and 13.

In this way, the external power supply systems for the reference voltage generator 6 and the internal power-supply voltage supplier 7 are isolated from each other, as the first external power supply system 11 and the second external power supply system 12. While the input/output circuit 4 includes plural buffer circuits and performs level conversion between internal signals and external signals, the external power supply system for the input/output circuit 4 is arranged as the third external power supply system 13 isolated from the external power supply systems for the power-supply voltage convertor 5.

Between the power-supply pins DIP1 to DIP4 and the power-supply pads PAD1 to PAD4, there are inductance components and resistance components parasitic on bonding wires 16 to 19, leads, and metallized patterns of the package. For this reason, external power-supply pins and power-supply pads that are connected with circuit portions consuming great power are, in practice, provided in large numbers. However, since the reference voltage generator 6 is a circuit for generating just the reference voltage Vref necessary for generating the internal power-supply voltage Vint, only a small current flows through the circuit 6. Therefore, supposing that the number of available external power supply pins is 80, such arrangement is made as allocating 15 pins for the external power supply pin DIP1, 1 pin for the external power supply pin DIP2, 24 pins for the external power supply pins DIP3, and the remaining pins for the external power supply pin DIP4 for the voltage $V_{ss}$. The ratio of number of the external power supply pins DIP1 to that of the external power supply pins DIP3 is determined according to the ratio of the power consumption in the internal circuit 3 to that in the input/output circuit 4.

In the described semiconductor integrated circuit, the internal power supply voltage Vint output from the internal power-supply voltage supplier 7 allows charging and discharging currents to flow according to the operations of the internal circuit 3 and the input/output circuit 4 and, as a result, produces a change in the power-supply current from the internal power-supply voltage supplier 7. The change in the current tends to generate a potential difference, due to inductance components and resistance components parasitic on the external power supply system 11 for the internal power-supply voltage supplier 7, across the same. At this time, since the reference voltage generator 6 is supplied with the external power supply Vdd2 from the power supply system 12 isolated from the power supply system 11 for the internal power-supply voltage supplier 7 and since the current flowing through the reference voltage generator 6 itself is stationary and relatively small in amount, there is produced substantially no current change in the isolated external power supply system 12 for the reference voltage generator 6. Consequently, the reference voltage Vref output from the reference voltage generator 6 is kept constant and, hence, the internal power-supply voltage supplier 7 controls the operating point of the circuit so as to make the internal power-supply voltage Vint equal to the constant reference voltage Vref, or to keep the ratio therebetween constant, so that the internal power-supply voltage Vint is kept constant. As a result, variations in the internal power-supply voltage Vint such as overshoot and undershoot are prevented from occurring and thus malfunction of the internal circuit 3 and input/output circuit 4 can be prevented and high-speed operations of these circuits can be ensured.

Figure 2:
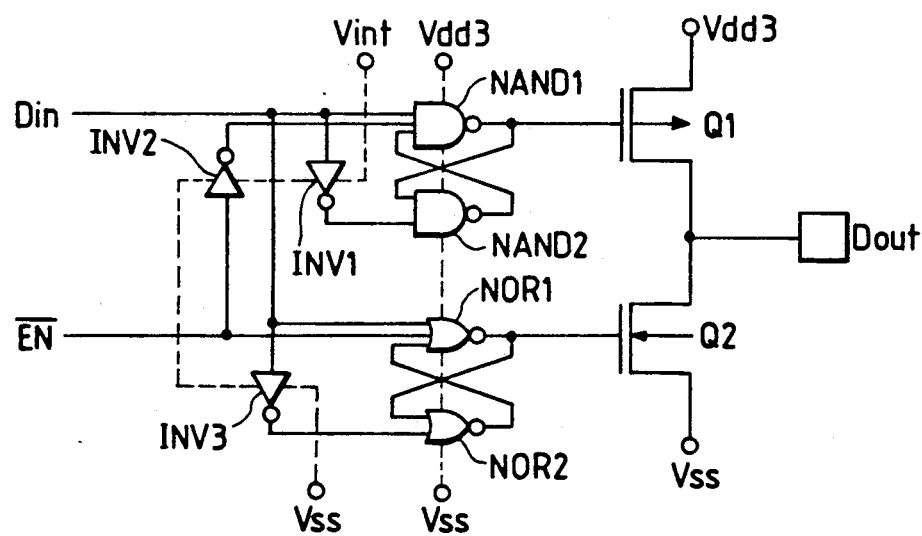
FIG. 2 is a logical circuit diagram as an example of an output buffer circuit included in an input/output circuit.

FIG. 2 shows an example of the output buffer circuit included in the input/output circuit 4.

The output buffer circuit shown in the figure is formed of, but not limited to, a complementary MOS (hereinafter briefly referred to as "CMOS") circuit. Referring to the figure, the p-channel MOSFET Q1 and n-channel MOSFET Q2 are transistors of relatively large size forming the output final stage. NAND gates NAND1 and NAND2 forming a flip-flop circuit and NOR gates NOR1 and NOR2 forming a flip-flop circuit are logic circuits for converting input logical levels of 0–3.3 V corresponding to the signal Din to levels of 0–5 V, thereby driving the MOSFETs Q1 and Q2. These transistors and logic gates are supplied with the external power-supply voltage Vdd3 at a level as 5 V through the third external power supply system 13. Inverters INV1 to INV3 operate on the internal power-supply voltage Vint at a level as 3.3 V supplied through the internal power supply system 15 and control the NAND gates NAND1 and NAND2 and the NOR gates NOR1 and NOR2. The flip-flops are arranged in the preceding stage of the gate electrodes of the MOSFET Q1 and Q2 to establish the gate voltages input to the MOSFET Q1 and Q2 in a stabilized manner in order that the buffer circuit performs its function to convert the logical level and output the converted logical level, and also to prevent through-currents from flowing through the gates, NAND1, NAND2, NOR1, and NOR2.

In the described buffer circuit, when an enable signal $\overline{EN}$ is brought to the high level, both the MOSFETS Q1 and Q2 are cut off and a high-impedance state is brought about.

When the enable signal $\overline{EN}$ is brought to the low level, the output buffer circuit performs an output operation in accordance with the level of the signal Din. More specifically, when the signal Din is brought to the high level, the flip-flop formed of the NAND gates NAND1 and NAND2 outputs a low level and the flip-flop formed of the NOR gates NOR1 and NOR2 also outputs a low level, and as a result, a signal Dout having a logical level as 5 V is output from the output final stage. On the other hand, when the signal Din is brought to the low level, the flip-flop formed of the NAND gates NAND1 and NAND2 outputs a high level and the flip-flop formed of the NOR gates NOR1 and NOR2 also outputs a high level, and as a result, a signal Dout having a logical level as 0 V is output from the output final stage.

Since the external power-supply voltage Vdd3 to the output buffer circuit is supplied from the system 13 isolated from the external power supply system for the power-supply voltage converter 5, the operation of the internal power-supply voltage supplier 7 is still stabilized even if there is produced a relatively great change in the current on account of simultaneous outputting operations of multiple bits in the multiple buffer circuits.

Figure 3:
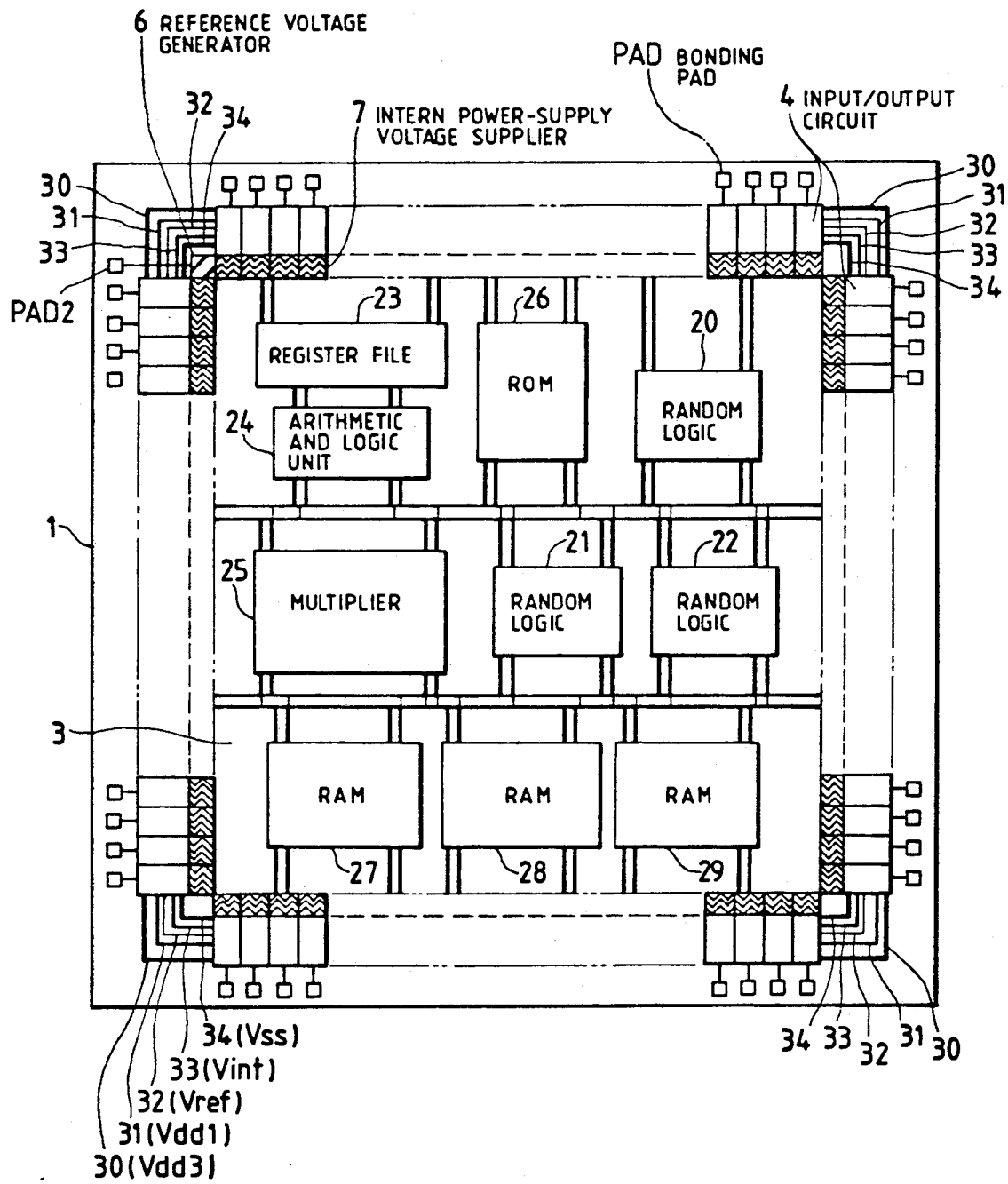
FIG. 3 is a schematic layout diagram of a chip in the semiconductor integrated circuit of FIG. 1.

FIG. 3 shows a schematic layout diagram of the chip 1. The semiconductor integrated circuit shown in the diagram is, but not limited to, a microcomputer formed in a standard cell system.

The internal circuit 3 is disposed in the center of the chip 1, wherein there are formed random logics 20 to 22, a register file 23, an arithmetic and logic unit 24, a multiplier 25, a ROM (read-only memory) 26, and RAMs (random-access memories) 27 to 29, etc., arranged to the custom requirement of the user.

The peripheral portion of the internal circuit 3 is appropriated to the area where numbers of the internal power-supply voltage suppliers 7 and the input/output circuits 4 are formed. There are disposed a plurality of bonding pads PAD for each of the input/output circuits 4. At the corner portion of the chip 1, there is formed one reference voltage generator 6. In FIG. 1, there are representatively shown one each of the input/output circuit 4 and the internal power-supply voltage supplier 7.

On the layer above the input/output circuit 4 and the internal power-supply voltage supplier 7 formed at the peripheral portion, there are arranged power-supply wirings for the internal power supply and external power supply, and the like. More specifically, referring to FIG. 3, reference numeral 30 denotes the power-supply wiring included in the third external power supply system 13 for supplying the external power-supply voltage Vdd3 to the input/output circuit 4, 31 denotes the power-supply wiring included in the first external power supply system 11 for supplying the external power-supply voltage Vdd1 to the internal power-supply voltage supplier 7, 32 denotes the control voltage wiring for supplying the reference voltage Vref output from the reference voltage generator 6 to its corresponding internal power-supply voltage supplier 7, 33 denotes the power-supply wiring as a trunk line included in the internal power supply system 15 for supplying the internal power-supply voltage Vint output from each internal power-supply voltage supplier 7 to the internal circuit 3, and 34 denotes the power-supply wiring included in the power supply system 14 for supplying the voltage $V_{SS}$ to all the circuits.

The input/output circuit 4 is set to any of the states of input circuit, output circuit, input/output circuit, and unused circuit depending on the performance required of the semiconductor integrated circuit. The setting is established by wiring mask. Required numbers of the bonding pads PAD are arranged to perform functions as the earlier mentioned power-supply pads PAD1 to PAD4, which are positioned corresponding to the unused input/output circuits 4. The bonding pads PAD positioned corresponding to the used input/output circuits 4 are arranged to perform as input terminals and output terminals of signals.

Figure 4:
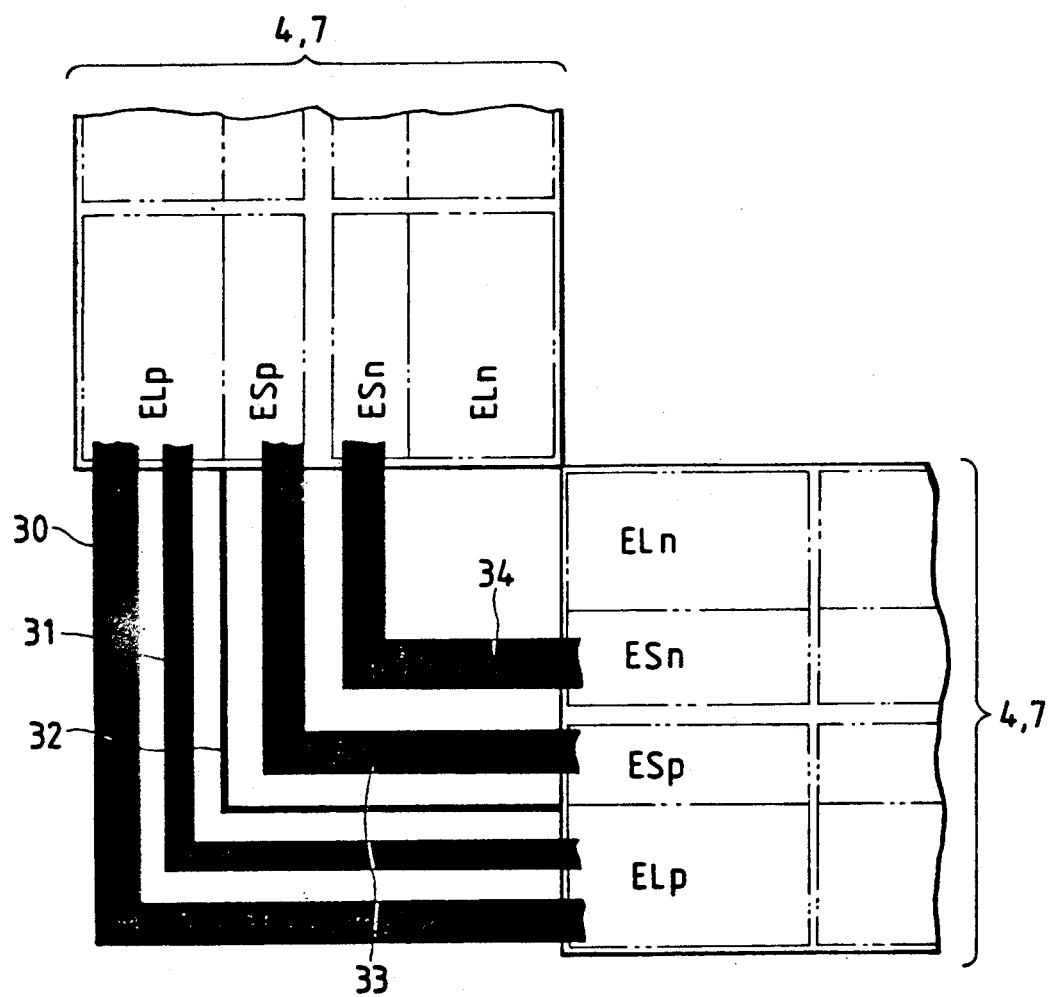
FIG. 4 is a detailed explanatory drawing of an example of a chip corner shown in FIG. 3.

FIG. 4 shows details of the corner portion of the periphery of the chip.

The area having the input/output circuit 4 and the internal power-supply voltage supplier 7 formed thereon is arranged, in practice, as shown in FIG. 4, such that a region ELn in which relatively large n-channel MOSFETs are formed and a region ELp in which relatively large p-channel MOSFETs are formed are disposed on both sides thereof and a region ESn in which relatively small n-channel MOSEFETs are formed and a region ESp where relatively small p-channel MOSFETs are formed are disposed therebetween.

Figure 5:
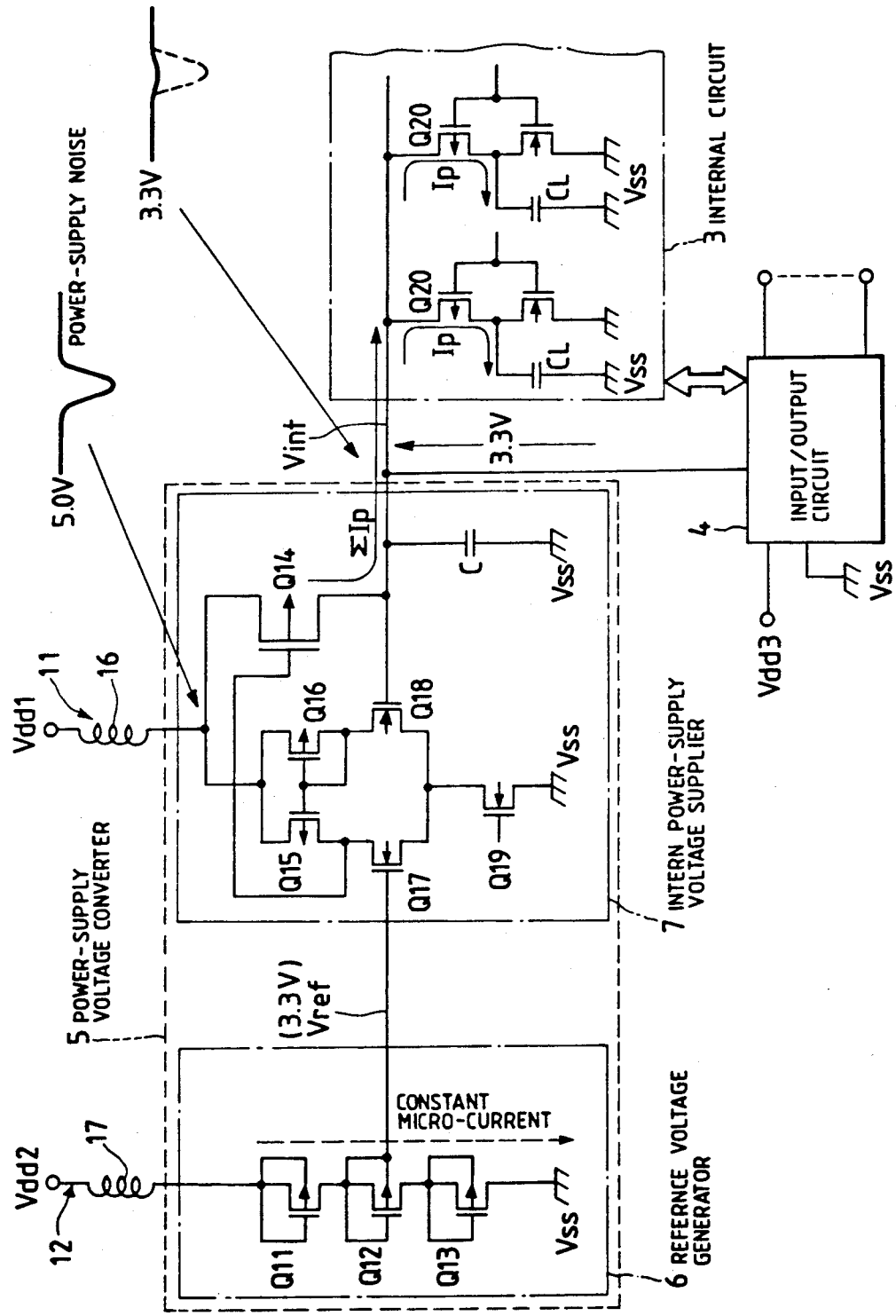
FIG. 5 is a circuit diagram of an example of a power-supply voltage converter and the like in the case where a semiconductor intergrated circuit is formed on a p-type semiconductor substrate.

FIG. 5 shows an example of the power-supply voltage converter 5.

The power-supply voltage converter 5 shown in FIG. 5 corresponds to the case where a semiconductor integrated circuit according to the present embodiment is formed on a p-type semiconductor substrate.

The reference voltage generator 6 is constituted of a resistance-type potential divider constructed of, but not limited to, three p-channel MOSFETs Q11 to Q13 uniform in characteristics and connected in series, each MOSFET having the gate electrode coupled with the source electrode. It is adapted therein such that the power-supply voltage Vdd2 of 5 V is resistance-divided and the voltage of the source electrode of the MOSFET Q12 is output as the reference voltage Vref. The reference voltage Vref at this time is set to 3.3 V. Since the reference voltage generator 6 is only required to generate a fixed reference voltage Vref through resistance-division, it is not required, in essence, to pass a large current therethrough. Hence, it is provided with relatively small conductance so that only a constant microcurrent is allowed to flow therethrough. The source electrode of each of the MOSFETs Q11–Q13 is coupled with the substrate gate of the MOSFET, that is, the n-type well region on which the MOSFET is formed, so that the variation in the threshold value caused by the substrate effect may be suppressed as much as possible.

The internal power-supply voltage supplier 7 has a p-channel type driving MOSFET Q14 for supplying the internal power-supply voltage Vint. The source electrode of the MOSFET Q14 is supplied with the power-supply voltage Vdd1 and the drain electrode serving as the output terminal of the internal power-supply voltage Vint. The drain electrode is coupled with a capacitor C for preventing oscillation. The capacitor C can be in the form of an n-channel MOSFET, in which case, the drain electrode and source electrode of the MOSFET are supplied with the voltage $V_{SS}$ and the gate electrode thereof is coupled with the drain electrode of the MOSFET Q14.

The driving MOSFET Q14 is controlled by a circuit in the form of a current mirror circuit, which is formed of a pair of p-channel MOSFETs Q15 and Q16, a pair of n-channel MOSFETs Q17 and Q18, and an n-channel power switch MOSFET Q19. The gate electrode of the input MOSFET Q17 is supplied with the reference voltage Vref at a level as 3.3 V generated by the reference voltage generator 6. The power switch MOSFET Q19 may be switch-controlled by the reference voltage Vref. The gate electrode of the other input MOSFET Q18 is connected with the node of the driving MOSFET Q14 and the capacitor C. Thus, the driving MOSFET Q14 is controlled by the voltage of the drain electrodes in common of the MOSFETs Q15 and Q17. The described circuit, in reference to the reference voltage Vref, controls the driving MOSFET Q14 and brings the internal power-supply voltage Vint to the voltage equal to the reference voltage Vref. Incidentally, sizes of the transistors, for example, are W (channel width) = 600 μm for the MOSFET Q14, W = 50 μm, approximately, for the MOSFETs Q15 to Q19, and W = 15 to 20 μm for the transistors included in the internal circuit 3.

Figure 7A:
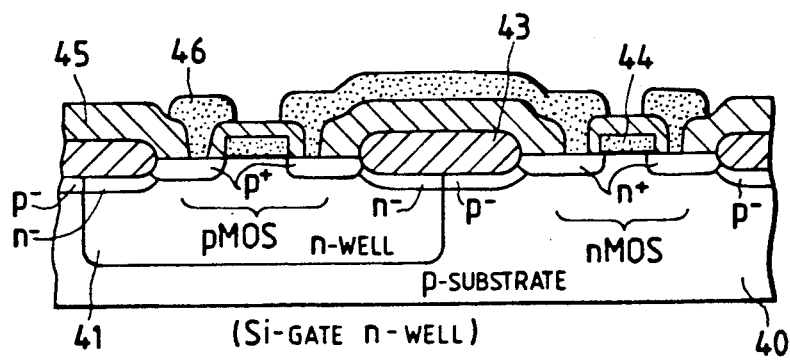
FIG. 7A to FIG. 7D are schematic sectional views showing examples of various device structure of CMOS circuits.
Figure 7B:
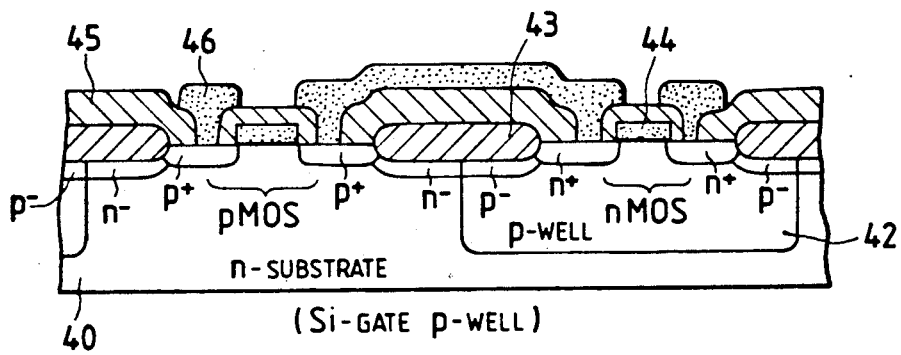
Figure 7C:
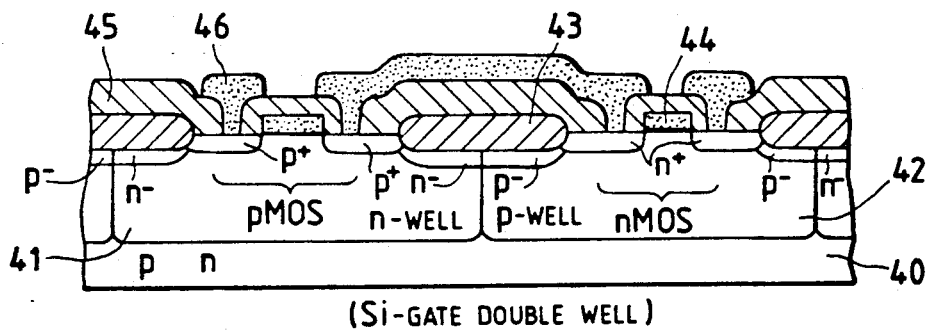

As a processed structure of the circuit shown in FIG. 5, such a structure as an Si-gate n-well structure shown in FIG. 7A or an Si-gate double-well structure shown in FIG. 7C can be adopted. Referring to each drawing, reference numeral 40 denotes a substrate, 41 denotes an n-type well region (n-well), 42 denotes a p-type well region (p-well), 43 denotes an element separating region, 44 denotes a gate oxide film, 45 denotes an insulating layer, and 46 denotes a conducting layer of aluminum or the like. In the case of the Si-gate n-well structure, the p-channel MOSFET (pMOS) is formed in the n-well 41 and the n-channel MOSFET (nMOS) is formed on the p-type semiconductor substrate. In the case of the Si-gate double-well structure, the p-channel MOSFET is formed in the n-well 41 and the n-channel MOSFET is formed in the p-well 42.

The operation of the power-supply voltage converter 5 having a circuit configuration as shown in FIG. 5 will be described below.

The internal power-supply voltage Vint output from the internal power-supply voltage supplier 7 allows charging and discharging currents to flow according to the operations of the internal circuit 3 and the input/output circuit 4 and, thereby, the power-supply current from the internal power-supply voltage supplier 7 is varied. For example, when plural p-channel MOSFETs Q20, which are representatively shown, in the internal circuit 3 are simultaneously turned on, a current Σ Ip corresponding to the sum total of charging currents Ip of capacitive loads CL flows in from the external power-supply pin DIP1 through the driving MOSFET Q14. At this time, the power-supply voltage Vdd1 internally undershoots on account of inductance and resistance components parasitic on the external power supply system 11 through which the current flows and, thereby, a power-supply noise is produced. On the other hand, in the reference voltage generator 6, it is adapted such that the MOSFETs Q11–Q13 have low resistance values in the on state and only a constant micro-current is passed therethrough. Because of this and also because the external power-supply voltage Vdd2 for the reference voltage generator 6 is supplied through the external power supply system 12 isolated from that for the power-supply voltage Vdd1, the power-supply voltage Vdd2 does not internally vary irrespective of the inductance and resistance components parasitic on the system 12, and as a result, the reference voltage Vref is constantly kept at 3.3 V. The internal power-supply voltage supplier 7 controls the conductance of the MOSFET Q14 so that the internal power-supply voltage Vint may become equal to the constant reference voltage Vref and the internal power-supply voltage Vint may be kept constant. Thus, the undershoot of the internal power-supply voltage Vint can be suppressed.

In the foregoing, the case where the semiconductor integrated circuit according to the present embodiment is formed on a p-type semiconductor substrate has been described, but the same can be formed on an n-type semiconductor substrate. In such case, the power supply on the low level side is arranged in two systems, i.e., internal and external systems, and the external system is separated into three systems. More specifically, referring to FIG. 1, the voltage $V_{ss}1$ ( 0 V) of the power supply on the low level side is applied to the external power-supply pin DIP1, the voltage $V_{ss}2$ (0 V) of the power supply on the low level side is applied to the external power-supply pin DIP2, and the voltage $V_{ss}3$ (0 V) of the power supply on the low level side is applied to the external power-supply pin DIP3. Meanwhile, the voltage Vdd (5 V) of the power supply on the high level side is supplied through the external power-supply pin DIP4 commonly to all the circuits.

Figure 6:
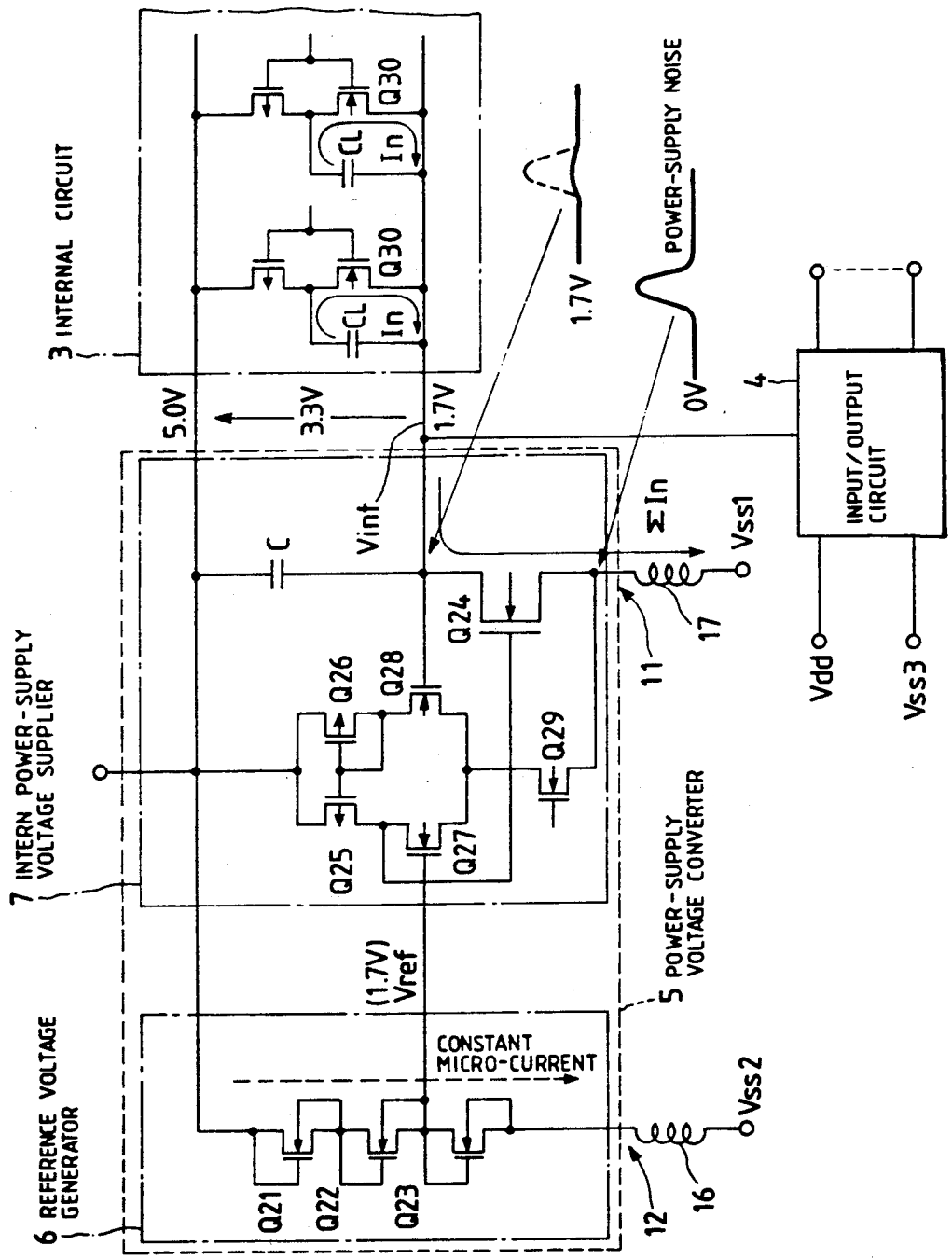
FIG. 6 is a circuit diagram of an example of a power-supply voltage converter and the like in the case where a semiconductor integrated circuit is formed on an n-type semiconductor substrate.

FIG. 6 shows an example of the power-supply voltage converter 5 in the case where the semiconductor integrated circuit is formed on an n-type semiconductor substrate.

The reference voltage generator 6 shown in FIG. 6 is constituted of a resistance-type potential divider constructed of, but not limited to, three n-channel MOSFETs Q21 to Q23 being uniform in characteristics and connected in series, each MOSFET having the gate electrode coupled with the source electrode. It is adapted therein such that the potential difference between the voltages $V_{ss}2$ and Vdd of 5 V is resistance-divided and the voltage of the source electrode of the MOSFET Q22 is output as the reference voltage Vref. The reference voltage Vref at this time is set to 1.7 V. Since the reference voltage generator 6 is only required to generate a fixed reference voltage Vref through resistance-division, it is not required, in essence, to pass a large current therethrough. Hence, it is provided with relatively small conductance so that only a constant micro-current is allowed to flow therethrough. The source electrode of each of the MOSFETs Q21–Q23 is coupled with the substrate gate of the MOSFET, that is, the p-type well region on which the MOSFET is formed, so that the variation in the threshold voltage caused by the substrate effect may be suppressed as much as possible.

The internal power-supply voltage supplier 7 shown in FIG. 6 has an n-channel type driving MOSFET Q24 for supplying the internal power-supply voltage Vint. The source electrode of the MOSFET Q24 has the source electrode supplied with power-supply voltage $V_{ss}1$ and the drain electrode serving as the output terminal of the internal power-supply Vint. The driving MOSFET Q24 is coupled with a capacitor C for preventing oscillation. The capacitor C can have the structure of a p-channel MOSFET, in which case, the drain electrode and source electrode of the MOSFET are supplied with the power-supply voltage Vdd and the gate electrode thereof is coupled with the drain electrode of the MOSFET Q24.

The driving MOSFET Q24 is controlled by a circuit structured of a current mirror circuit, which is formed of a pair of p-channel MOSFETs Q25 and Q26, a pair of n-channel MOSFETs Q27 and Q28, and an n-channel power switch MOSFET Q29. The gate electrode of the input MOSFET Q27 is supplied with the reference voltage Vref at a level as 1.7 V generated by the reference voltage generator 6. The gate electrode of the other input MOSFET Q28 is connected with the drain electrode of the driving MOSFET Q24. The driving MOSFET Q24 is controlled by the voltage of the drain electrodes in common of the MOSFETs Q25 and Q27. The circuit, in reference to the reference voltage Vref, controls the driving MOSFET Q24 and brings the internal power-supply voltage Vint to the voltage equal to the reference volatge Vref.

As a processed structure of the circuit shown in FIG. 6, such a structure as an Si-gate p-well structure shown in FIG. 7B or an Si-gate double-well structure shown in FIG. 7C can be adopted. In the case of the Si-gate p-well structure, the p-channel MOSFET (pMOS) is formed on the n-type substrate 40 and the n-channel MOSFET (nMOS) is formed in the p-type well 41.

The operation of the power-supply voltage converter 5 having a circuit configuration as shown in FIG. 6 will be described below.

For example, when plural n-channel MOSFETs Q30, which are representatively shown, in the internal circuit 3 are simultaneously turned on, a current $\Sigma$ In corresponding to the sum total of discharging currents In of capacitive loads CL is allowed to flow to the external power-supply pin DIP1 through the driving MOSFET Q24. At this time, the power-supply voltage $V_{ss}1$ internally overshoots on account of inductance and resistance components parasitic on the external power supply system 11 through which the current flows and, thereby, a power-supply noise is produced. On the other hand, in the reference voltage generator 6, it is adapted such that the MOSFETs Q21–Q23 have low resistance values in the on state and only a constant micro-current is passed therethrough. Because of this and also because the external power-supply voltage $V_{ss}2$ for the reference voltage generator 6 is supplied through the external power supply system 12 isolated from that for the power-supply voltage $V_{ss}1$, the power-supply voltage $V_{ss}2$ does not internally vary irrespective of the inductance and resistance components parasitic on the system 12, and as a result, the reference voltage Vref is constantly kept, for example, at 1.7 V. The internal power-supply voltage supplier 7 controls the conductance of the MOSFET Q24 so that the internal power-supply voltage Vint may become equal to the constant reference voltage Vref and the internal power-supply voltage Vint may be kept constant at 1.7 V. Thus, the overshoot of the internal power-supply voltage Vint can be suppressed.

In the foregoing description with reference to FIG. 5 and FIG. 6, measures have been taken against the variation in the internal power-supply voltage only on the low-level side or the high-level side, but it is also possible to take measures against the power source noise on both sides of the power-supply voltage.

Figure 8:
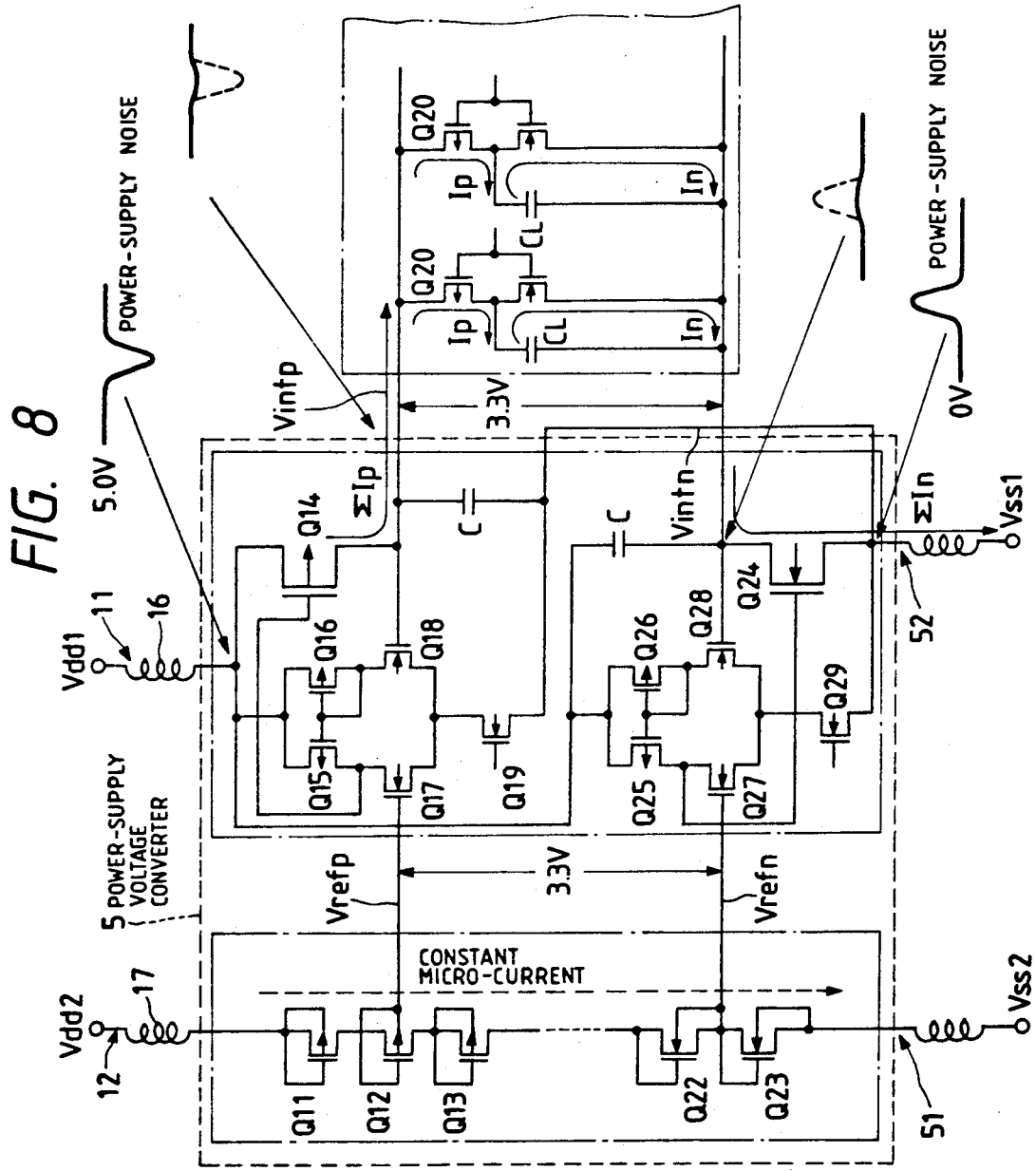
FIG. 8 is a circuit diagram showing an example of a power-supply voltage converter formed by combining the circuit configurations shown in FIG. 5 and FIG. 6.

More specifically, as shown in FIG. 8, the structure of FIG. 5 and the structure of FIG. 6 can be combined so that the power-supply voltages Vdd1 and Vdd2 on the high level side and the power-supply voltages $V_{ss}1$ and $V_{ss}2$ on the low level side may be respectively supplied from power supply systems 16, 17, 51, and 52 isolated from each other. At this time, the potential difference between the reference voltage Vrefp on the high level side and the reference voltage Vrefn on the low level side is set to 3.3 V and, correspondingly, the potential difference between the internal power-supply voltage Vintp on the high level side and the internal power-supply voltage Vintn on the low level side is also set to 3.3 V. With such arrangement, it is intended to prevent occurrence of variations in the internal power-supply voltages for the internal circuit 3 and the input/output circuit 4 both in charging and discharging operations.

However, when such a circuit configuration as shown in FIG. 8 is adopted, the power supply systems on both high level side and low level side become large in number and, therefore, measures against latch-up must be considered in the device construction.

Figure 9:
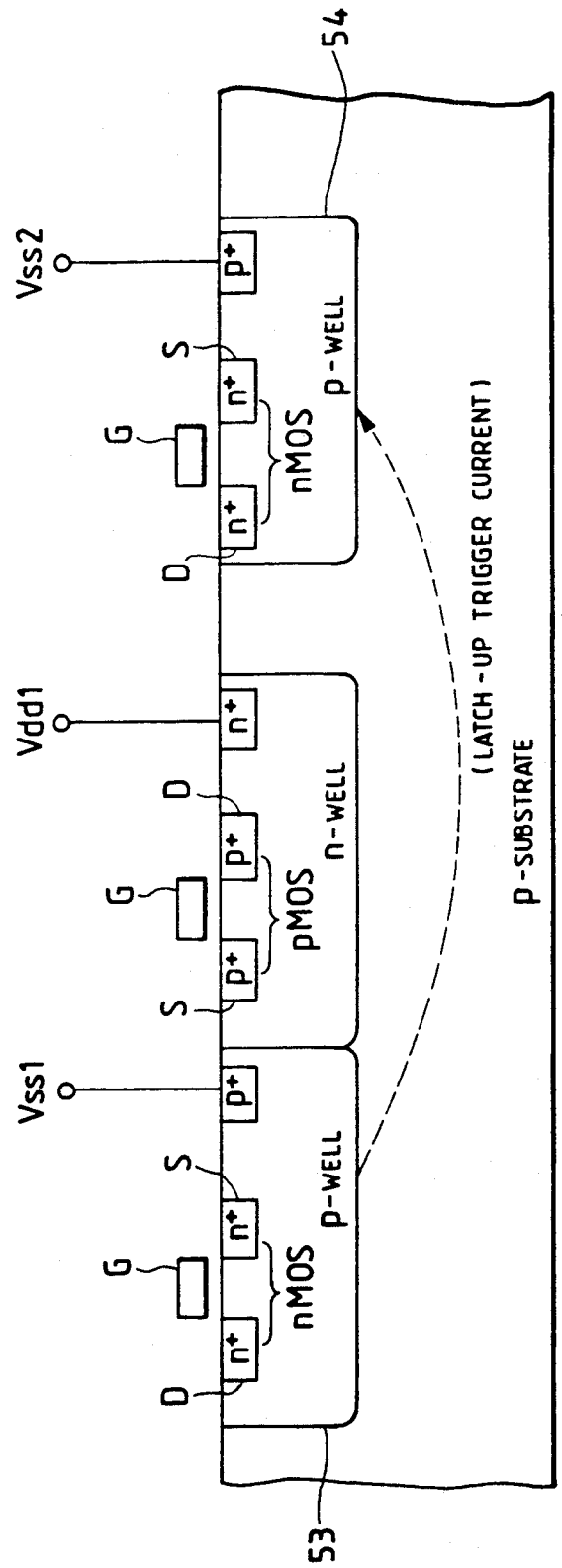
FIG. 9 is a sectional view of an example of device structure in the case where the circuit of FIG. 8 is adopted.

More specifically, when the transistors constituting the circuit of FIG. 8 are in the Si double well structure as shown in FIG. 7C, each of the power supply systems must be formed in the separate well region. For example, the device structure may be arranged as schematically shown in FIG. 9. In this case when the current $\Sigma$ In as shown in FIG. 8 flows and the voltage $V_{ss}1$ overshoots, it is supposed that a potential difference is produced between the same and the other power-supply voltage $V_{ss}2$ on the low level side and, accordingly, carriers move from one p-well 53 to the other p-well 54 and this gives rise to trigger current to cause the latch-up.

To completely prevent such latch-up from occurring, it is well to adopt an SOS (silicon on sapphire) structure or an SOI (silicon on insulator) structure, in which transistors of mutually different types of conduction may be formed on an insulating substrate isolated from each other and, thereby, resistivity to the latch-up is improved.

Figure 7D:
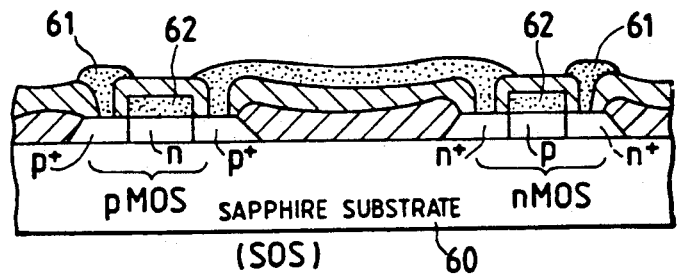

The SOS structure is fabricated, for exmaple, as shown in FIG. 7D, by having a single crystal grown on the sapphire substrate 60 and having diffused regions or impurity regions formed thereon, thereby forming a MOSFET. Reference numeral 61 denotes a conductive layer of such a material as aluminum and 62 denotes a gate oxide film.

In taking a measure, for a CMOS circuit, against the power supply noise on one side of the power supply, i.e., the high level side or the low level side as shown in FIG. 5 or FIG. 6, the measure may be taken for the side which is presumed to have the larger power source noise of the two.

While the invention made by the inventor has been described with reference to particular embodiments, it will be apparent that the present invention is not to be limited to such embodiments but various changes may be made without departing from the spirit and scope of the invention.

In the foregoing, the embodiments have been described as to the cases where they are formed of CMOS circuits, but the invention can be embodied with single-channel MOS circuits of n-channel or p-channel type. In such case, the measures against the latch-up is completely unnecessary and, hence, an SOS structure or SOS structure need not be adopted. Also, the reference voltage generator, the internal power-supply voltage supplier, and the input/output circuit can be suitably modified. Although, in the above description, separate power supply systems have been used for the external power supply to the input/output circuit and the external power supply to the internal power-supply voltage supplier, it may be arranged such that both the circuits are supplied with power from a common external power supply system.

While, in the foregoing description, emphasis has been placed on prevention of variation in the internal power-supply voltage due to inductance components and resistance components existing within the semicondutor integrated circuit, if inductance components and resistance components parasitic on the wirings on the substrate on which the semiconductor integrated circuit is mounted should be taken care of, it is possible to arrange such that the power-supply wiring mounted on the substrate can be isolated from each other for each external power supply system for the semiconductor integrated circuit.

When, as in the above described embodiment, a plurality of internal power-supply voltage suppliers are separately provided, the internal power supply system may be divided into a plurality of systems.

While the foregoing description has been chiefly made of the case where the invention made by the inventor is applied to a one-chip microcomputer arranged in a standard cell system, which has been in the field of utilization to which the present invention has been directed, the present invention is not limited thereto but it can be widely applied to various semiconductor integrated circuits such as peripheral controllers and peripheral circuits and the designing of the semiconductor integrated circuit may be of gate array or of custom arrangement.

The effects obtained from representative aspects of the present invention disclosed herein my be briefly described as follows.

In a semiconductor integrated circuit in which the external power-supply voltage is converted to a lower internal power-supply voltage to be used, the external power supply systems for the reference voltage generator and the internal power-supply voltage supplier for outputting an internal power-supply voltage according to the reference voltage output from the reference voltage generator, both circuits being included in the power-supply voltage converter, are arranged to be independent of each other on the high level side, low level side, or both. Thus, since the reference voltage generator is supplied with the external power supply from the system isolated from the power supply system for the internal power-supply voltage supplier and since the current flowing therethrough is stationary and relatively small in amount, there is produced substantially no current variation in the external power supply system separately provided for the reference voltage generator even if the power-supply current in the internal power-supply voltage supplier varies according to the operations of the internal circuit and the input/output circuit. Accordingly, the reference voltage output from the reference voltage generator can be kept constant and the internal power-supply voltage supplier is controlled for its operating point by virtue of the constant reference voltage and, hence, it functions so as to keep the internal power-supply voltage constant. As a result, an effect is obtained that such variations as overshoot or undershoot of the internal power-supply voltage can be suppressed.

Consequently, such effects are obtained that the malfunction of the internal circuits and buffer circuits are prevented and their fast operations are assured.

Since the system for inputting the external power to the reference voltage generator is made is stabilized, a circuit like a resistance-divider relatively simple in structure and not requiring individual adjustment can be used as the reference voltage generator. Therefore, there is no need for using such a circuit which generates a reference voltage making use of the difference in threshold voltages of an n-channel MOSFET and a p-channel MOSFET. Circuits making use of the difference in the threshold values have variations in the threshold voltage depending on the processing conditiions and they require trimming resistance circuit or the like for adjustment of the threshold voltage.

In the case of semiconductor integrated circuit including complementary MOS circuits formed on a p-type semiconductor substrate, the external power supply systems for the reference voltage generator and the internal power-supply voltage supplier are arranged to be independent of each other on the low level side. In the case of semiconductor integrated circuit including complementary MOS circuits formed on an n-type semiconductor substrate, the external power supply systems for the reference voltage generator and the internal power-supply voltage supplier and arranged to be independent of each other on the high level side. By thus taking the measures only for the low level side or the high level side, the latch-up can be preferentially prevented without using the SOS structure SOI structure and elimination of the power supply noise can thereby be achieved to a considerable degree. In the above, the preventing of the latch-up is to prevent a latch-up trigger current from flowing between plural well regions, of which the type of conduction is the same as the semiconductor substrate.

In comnplementary MOS circuits, by adopting the SOS or SOI structure having transistors of mutually differnet types of conduction separately formed on an insulating substrate and thereby made excellent in resistivity to the latch-up, such an effect is obtained that the measures against internal power-supply noise can be taken for both low level side and high level side of the power supply systems in such semiconductor integrated circuit without caring about the problem of the latch-up.

By arranging the same voltage to be applied to the external power supply systems provided independently of each other, the system structure can be made convenient for use. In the characteristic tests and acceleration tests, the internal power-supply voltage can be simply controlled without changing the power-supply voltage applied to the internal power-supply voltage supplier, but just by changing the voltage applied to the external power input system for the reference voltage generator.

The number of the reference voltage generators can be decreased by disposing wirings for supplying reference voltages at the peripheral portion of the substrate, thereby supplying reference voltages to a plurality of internal power-supply voltage suppliers in parallel or in common.

By supplying the external power voltage to the buffer circuit performing level conversion from the external signal to the internal signal through a power supply system isolated from the power supply system to the power-supply voltage converter, the operation of the internal power-supply voltage supplier can further be stabilized even if there is produced a relatively great variation in the power-supply current due to simultaneous outputting operations of multiple bits in the buffer circuit.

What is claimed is:

1. A semiconductor integrated circuit comprising:
   a first external power-supply voltage terminal;
   a second external power-supply voltage terminal;
   a reference voltage generator having a first power-supply voltage terminal coupled with said second external power-supply voltage terminal, and having an output signal;
   an internal power-supply voltage supplier, having a first power-supply voltage terminal coupled with said first external power-supply voltage terminal, for generating an internal power-supply voltage according to the output signal of said reference voltage generator; and
   an internal circuit having a power-supply voltage terminal supplied with said internal power-supply voltage supplier.

2. A semiconductor integrated circuit according to claim 1, wherein
   said internal power-supply voltage supplier has means for conversion of an external power-supply voltage supplied to said second external power-supply voltage terminal into said internal power-supply voltage having a value different from that of the external power-supply voltage.

3. A semiconductor integrated circuit according to claim 2, further comprising:
   a third external power-supply voltage terminal coupled with a second power-supply voltage terminal of said reference voltage generator and with a second power-supply voltage terminal of said internal power-supply voltage supplier, wherein
   said first external power-supply voltage terminal and said second external power-supply voltage terminal are adapted for receiving an external power-supply voltage on the high level side, and wherein said third external power-supply voltage terminal is adapted for receiving an external power-supply voltage on the low level side.

4. A semiconductor integrated circuit according to claim 3, wherein
   said means for conversion converts the external power-supply voltage supplied to said second external power-supply voltage terminal into said internal power-supply voltage having a value lower than the external power-supply voltage.

5. A semiconductor integrated circuit according to claim 2, further comprising:
   a third external power-supply voltage terminal coupled with a second power-supply voltage terminal of said reference voltage generator and with a second power-supply voltage terminal of said internal power-supply voltage supplier, wherein
   said first external power-suppy voltage terminal and said second external power-supply voltage terminal are adapted for receiving an external power-supply voltage on the low level side, and wherein said third external power-supply voltage terminal is adapted for receiving an external power-supply voltage on the high level side.

6. A semiconductor integrated circuit according to claim 5, wherein
   said means for conversion converts the external power-supply voltage supplied to said second external power-supply voltage terminal into said internal power-supply voltage having a value higher than the external power-supply voltage.

7. A semiconductor integrated circuit according to claim 4, wherein said semiconductor integrated circuit is formed on a single chip.

8. A semiconductor integrated circuit according to claim 4, wherein said semiconductor integrated circuit is formed on a p-type substrate.

9. A semiconductor integrated circuit according to claim 3, wherein said output signal of said reference voltage generator includes a first reference voltage and a second reference voltage, said reference voltage generator including
   a first resistance-type potential divider coupled to said first power-supply voltage terminal of said reference voltage generator for outputting said first reference voltage, and
   a second resistance-type potential divider coupled to said second power-supply voltage terminal of said reference voltage generator for outputting said second reference voltage.

10. A semiconductor integrated circuit according to claim 9, wherein
    said internal power-supply voltage supplier includes a first MOSFET and a first current mirror circuit and a second MOSFET and a second current mirror circuit,
    said first current mirror circuit is connected to said first resistance-type potential divider and receives said first reference voltage,
    said second current mirror circuit is connected to said second resistance-type potential divider and receives said second reference voltage,
    said first MOSFET being coupled to said first power-supply voltage terminal of said internal power-supply voltage supplier and being driven by said first current mirror circuit, and
    said second MOSFET being coupled to said second power-supply voltage terminal of said internal power-supply voltage supplier and being driven by said second current mirror circuit.

11. A semiconductor integrated circuit according to claim 10, wherein
    said semiconductor integrated circuit is formed with a silicon on sapphire structure.

12. A semiconductor integrated circuit according to claim 11, wherein
    said semiconductor integrated circuit is formed with a silicon on insulator structure.

13. A semiconductor integrated circuit according to claim 4, including an input/output circuit coupled with said internal circuit, and a fourth external power-supply voltage terminal adapted for receiving a power-supply voltage on the high level side,
    wherein said input/output circuit has a first power-supply voltage terminal coupled with said fourth external power-supply voltage terminal, a second power supply voltage terminal coupled with said third external power-supply voltage terminal, and said input/output circuit being coupled with said internal power-supply voltage from said internal power-supply voltage supplier.

14. A semiconductor integrated circuit according to claim 13, wherein said input/output circuit includes an output buffer circuit.

15. A semiconductor integrated circuit according to claim 14, wherein said output buffer circuit includes an output final stage and logic circuits for converting input logic levels of the internal circuit into driving levels for said output final stage,
said output final stage includes a p-channel MOSFET and an n-channel MOSFET, and
said logic circuits have first and second flip-flop circuits, said first flip-flop circuit including two NAND gates and said second flip-flop circuit including two NOR gates.

16. A semiconductor integrated circuit according to claim 4, wherein said reference voltage generator includes a resistance-type potential divider for outputting a said output signal.

17. A semiconductor intergrated circuit according to claim 16, wherein said resistance-type potential divider includes first, second and third p-channel MOSFETs connected in series,
each p-channel MOSFET having gate, drain and source electrodes,
wherein the gate electrode of each p-channel MOSFET is connected with the source electrode of the same p-channel MOSFET,
the source electrode of said first p-channel MOSFET is connected to said first power-supply voltage terminal of said reference voltage generator, and
the drain electrode of said third p-channel MOSFET is connected to said second power-supply voltage terminal of said reference voltage generator.

18. A semiconductor integrated circuit according to claim 16, wherein
said reference voltage generator has a relatively small conductance and passes a constant micro-current.

19. A semiconductor integrated circuit according to claim 17, wherein
said reference voltage generator has a relatively small conductance and passes a constant micro-current.

20. A semiconductor integrated circuit according to claim 4, wherein said internal power-supply voltage supplier includes a first MOSFET and a current mirror circuit,
said first MOSFET having a source electrode, a gate electrode and a drain electrode,
said source electrode being coupled with said second external power-supply terminal,
said gate electrode being coupled with said current mirror circuit, and
said drain electrode outputting said internal power-supply voltage.

21. A semiconductor integrated circuit according to claim 20, wherein said current mirror circuit includes a second MOSFET, a third MOSFET, a fourth MOSFET, a fifth MOSFET, and a sixth MOSFET,
each MOSFET having source, gate and drain electrodes,
wherein said second and third MOSFETs are p-channel MOSFETs, said fourth and fifth MOSFETs are n-channel MOSFETs, and said sixth MOSFET is an n-channel power switch MOSFET,
the gate electrode of said fourth MOSFET is supplied with the output signal of said reference voltage generator,
the drain electrodes of said fourth MOSFET and said second MOSFET are connected with the gate electrode of said first MOSFET,
the source electrodes of said second MOSFET and said third MOSFET are both connected with the source electrode of said first MOSFET,
the source electrodes of said fourth MOSFET and said fifth MOSFET are connected with the drain electrode of said sixth MOSFET,
the source electrode of said sixth MOSFET is coupled with said third external power-supply voltage terminal
the gate electrodes of said second MOSFET and said third MOSFET and the drain electrodes of said third MOSFET and said fifth MOSFET are all commonly connected, and
the gate electrode of said fifth MOSFET is connected with drain electrode of said first MOSFET.

22. A semiconductor integrated circuit according to claim 20, wherein said internal power-supply voltage supplier further includes a capacitor connected to said drain electrode of said first MOSFET.

23. A semiconductor integrated circuit according to claim 21, wherein said internal power-supply voltage supplier further includes a capacitor connected to said drain electrode of said first MOSFET.

24. A semiconductor integrated circuit according to claim 23, wherein said capacitor is in the form of an n-channel MOSFET.

25. A semiconductor integrated circuit according to claim 24, wherein said semiconductor integrated circuit is formed on a p-type substrate.

26. A semiconductor integrated circuit according to claim 23, wwherein said reference voltage generator includes a resistance-type potential divider for outputting said output signal.

27. A semiconductor integrated circuit according to claim 26, wherein
said reference voltage generator has a relatively small conductance and passes a constant micro-current.

28. A semiconductor integrated circuit according to claim 26, wherein said resistance-type potential divider includes first, second and third p-channel MOSFETs connected series,
each p-channel MOSFET having gate, drain and source electrodes,
wherein the gate electrode of each p-channel MOSFET is connected with the source electrode of the same p-channel MOSFET,
the source electrode of said first p-channel MOSFET is connected to said first power-supply voltage terminal of said reference voltage generator, and
the drain electrode of said third p-channel MOSFET is connected to said second power-supply voltage terminal of said reference voltage generator.

29. A semiconductor integrated circuit according to claim 28, wherein
said reference voltage generator has a relatively small conductance and passes a constant micro-current.

30. A semiconductor integrated circuit according to claim 28, wherein said semiconductor integrated circuit is formed on a single chip.

31. A semiconductor integrated ciurcuit according to claim 28, wherein said semiconductor integrated circuit is formed on a p-type substrate.

32. A semiconductor integrated circuit according to claim 31, wherein n-wells are formed in said p-type substrate, said p-channel MOSFETs being formed in said n-wells, and said n-channel MOSFETs being formed on said p-type substrate.

33. A microcomputer formed on a semiconductor chip comprising:

a first external power-supply voltage terminal;

a second external power-supply voltage terminal;

reference voltage generator having a first power-supply voltage terminal coupled with said second external power-supply voltage terminal, and having an output signal;

an internal power-supply voltage supplier, having a first power-supply voltage terminal coupled with said first external power-supply voltage terminal, for generating an internal power-supply voltage according to the output signal of said reference voltage generator; and an internal circuit having a power-supply voltage terminal supplied with said internal power-supply voltage supplier.

34. A microcomputer according to claim 33, wherein said internal circuit includes a register file, an arithmetic and logic unit, a multiplier, a read-only memory, and a random access memory.

35. A microcomputer according to claim 34, wherein said microcomputer is formed on a single chip.

36. A microcomputer according to claim 33, wherein said internal power-supply voltage supplier has means for conversion of an external power-supply voltage supplied to said second external power-supply voltage terminal into said internal power-supply voltage having a value different from that of the external power-supply voltage.

37. A microcomputer according to claim 36, further comprising:

a third external power-supply power-supply voltage terminal coupled with a second power-supply voltage terminal of said reference voltage generator and with a second power-supply voltage terminal of said internal power-supply voltage supplier, wherein said first external power-supply voltage terminal and said second external power-supply voltage terminal are adapted for receiving an external power-supply voltage on the high level side, and wherein said third external power-supply voltage terminal is adapted for receiving an external power-supply voltage on the low level side.

38. A microcomputer according to claim 37, wherein said means fopr conversion converts the external power-supply voltage supplied to said second external power-supply voltage terminal into said internal power-supply voltage having a value lower than the external power-supply voltage.

* * * * *